(12) United States Patent  
Graham et al.

(10) Patent No.: US 6,515,925 B2  
(45) Date of Patent: Feb. 4, 2003

(54) BALANCED SENSE AMPLIFIER CONTROL FOR OPEN DIGIT LINE ARCHITECTURE MEMORY DEVICES

(75) Inventors: Scot M. Graham, Boise, ID (US); Scott J. Derner, Meridian, ID (US); Stephen R. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/805,933

(22) Filed: Mar. 15, 2001

(65) Prior Publication Data

US 2002/0131311 A1 Sep. 19, 2002

(51) Int. Cl.[7] .................................................. G11C 7/00
(52) U.S. Cl. .................... 365/205; 365/207; 365/230.03
(58) Field of Search .............................. 365/205, 207, 365/208, 230.06, 63, 185.13, 189.04, 230.03

(56) References Cited

U.S. PATENT DOCUMENTS 5,546,343 A * 8/1996 Elliott et al. ........... 365/189.04
5,844,833 A   12/1998 Zagar et al.
6,147,919 A * 11/2000 Kawabata et al. ........ 365/208
6,226,212 B1 * 5/2001 Sakamoto et al. ........ 365/206

FOREIGN PATENT DOCUMENTS

JP         409167486 A  *  6/1997

* cited by examiner

Primary Examiner—David Nelms  
Assistant Examiner—David Lam  
(74) Attorney, Agent, or Firm—Dickstein Shapiro Morin & Oshinsky LLP (57) ABSTRACT

A balanced sense amplifier control for open digit line architecture memory devices. Firing of the sense amplifiers on each side of a section of a memory device is controlled by a two stage NAND gate logic circuit that utilizes a tree routing scheme. By gating the global signal with a section signal through the two stage NAND gate logic circuit, the sense amplifiers on each side of a section can be fired simultaneously.

73 Claims, 6 Drawing Sheets

BALANCED SENSE AMPLIFIER CONTROL FOR OPEN DIGIT LINE ARCHITECTURE MEMORY DEVICES

BACKGROUND OF THE INVENTION

1. Field of the Invention

The present invention relates generally to semiconductor memory devices and, more particularly, to an open digit line architecture memory device having a balanced sense amplifier control.

2. Description of the Related Art

An increasing number of electronic equipment and electronic-based systems require some form of high-speed memory devices for storing and retrieving information (or "data"). While the types of such memory devices vary widely, semiconductor memory devices are most commonly used in memory applications requiring implementation in a relatively small area. Within this class of semiconductor memory devices, the DRAM (Dynamic Random Access Memory) is one of the more commonly used types.

The DRAM has memory arrays consisting of a number of intersecting row and column lines of individual transistors or memory cells. In a conventional dynamic random access memory (DRAM) device each memory cell, or memory bit, consists of one transistor and one capacitor. A terminal of the transistor is connected to a digit line, or bitline, of the memory device. Another terminal of the transistor is connected to a terminal of the capacitor and the gate terminal of the transistor is connected to a wordline of the memory device. The transistor thus acts as a gate between the digit line and the capacitor.

The second terminal of the capacitor is connected to a voltage rail which carries a voltage, such as VCC/2. Thus, when the wordline for a particular cell is active, the gate transistor is in a conducting state and the capacitor is connected to the digit line. The capacitor stores a charge that, depending on whether the polarity of the voltage across the capacitor is positive or negative, represents either a logic high or a logic low value.

Typically, a microcomputer circuit selects (or activates) particular row and column lines to access selected memory cells. "Access" typically refers to reading data from or writing data to selected memory cells. Reading data from the memory cells involves the use of a sense amplifier to detect whether the voltage level stored in the memory cell represents a binary one or a binary zero.

Figure 1:
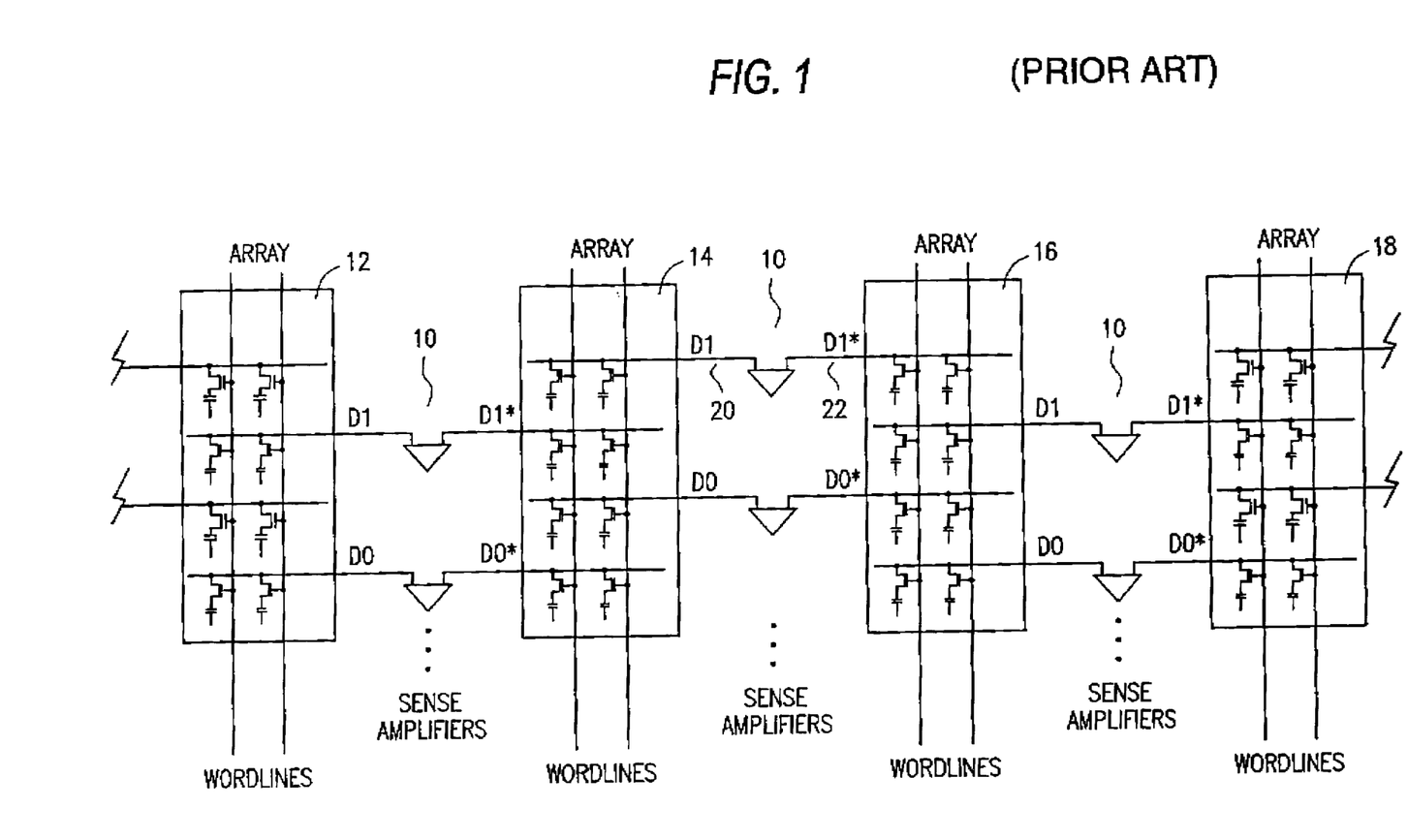
FIG. 1 illustrates in block diagram form a portion of a memory device having an open digit line architecture.

Memory devices are typically constructed with complementary digit lines of equal capacitance. Sense amplifiers are connected between the digit lines and operate to sense the differential voltage across the digit lines. An open digit line architecture, as illustrated in FIG. 1, features the sense amplifier circuits 10 between arrays 12, 14, 16, 18. True and complement digit lines, such as for example D1 20 and D1* 22 come from separate arrays 14, 16 on each side of the sense amplifiers 10 as illustrated in FIG. 1.

Figure 2:
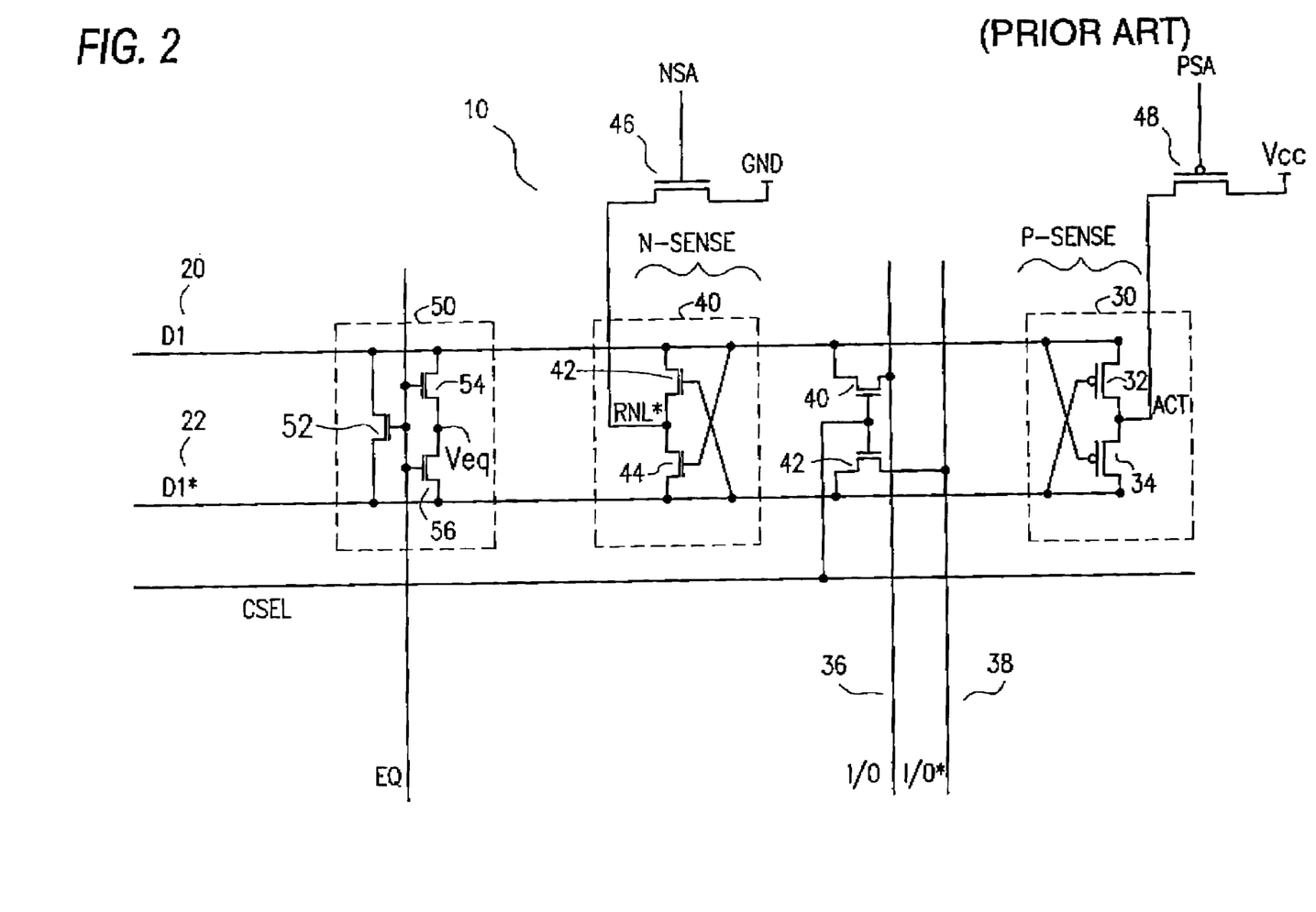
FIG. 2 illustrates a conventional sense amplifier circuit.

Operation of the sense amplifiers 10 is accomplished by applying various signals to each sense amplifier to fire the sense amplifiers as is well known in the art. FIG. 2 illustrates the circuitry of a sense amplifier 10 of FIG. 1. As is generally known in the art, the term sense amplifier includes a collection of circuit elements connected to the digit lines of a DRAM array. This collection typically includes devices for equilibration and bias, one or more N-sense amplifiers, one or more P-sense amplifiers, and devices connecting selected digit lines to input/output signal lines as will be described below.

As shown in FIG. 2, sense amplifier 10 includes a P-sense amplifier 30 and an N-sense amplifier 40 for sensing charge stored in the selected memory cell of the selected array via a voltage differential on the pair of digit lines D1 20 and D1* 22. Equilibration circuit 50 is provided to equilibrate the digit lines D1 20 and D1* 22. Equilibration circuit 50 includes transistor 52 with a first source/drain region coupled to digit line D1 20, a second source/drain region coupled to digit line D1* 22 and a gate coupled to receive an equilibration signal EQ. Equilibration circuit 50 further includes first and second transistors 54 and 56. Transistor 54 includes a first source/drain region that is coupled to digit line D1 20, a gate that is coupled to receive the equilibration signal EQ and a second source/drain region that is coupled to receive an equilibration voltage Veq, which is typically equal to Vcc/2. Second transistor 56 includes a first source/drain region that is coupled to digit line D1* 22, a gate that is coupled to receive the equilibration signal EQ and a second source/drain region that is coupled to the equilibration voltage Veq. When the signal EQ is at a high logic level, equilibration circuit 50 effectively shorts digit line D1 20 to digit line D1* 22 such that both lines are equilibrated to the voltage Veq.

When P-sense amplifier 30 and N-sense amplifier 40 have sensed the differential voltage across the digit lines D1 20 and D1* 22 (as described below), a signal representing the charge stored in the accessed memory cell is output from the DRAM device on the input/output (I/O) lines I/O 36 and I/O* 38 by connecting the I/O lines I/O 36 and I/O* 38 to the digit lines D1 20 and D1* 22, respectively. A column select (CSEL) signal is applied to transistors 42 to turn them on and connect the digit lines D1 20 and D1* 22 to the I/O lines I/O 36 and I/O* 38.

The operation of the P-sense amplifier 30 and N-sense amplifier 40 is as follows. These amplifiers work together to detect the access signal voltage and drive the digit lines D1 20 and D1* 22 to Vcc and ground accordingly. As shown in FIG. 2, the N-sense amplifier 40 consists of cross-coupled NMOS transistors 42, 44 and drives the low potential digit line to ground. Similarly, the P-sense amplifier 30 consists of cross-coupled PMOS transistors 32, 34 and drives the high potential digit line to Vcc. The NMOS pair 42, 44 or N-sense-amp common node is labeled RNL*. Similarly, the P-sense-amp 30 common node is labeled ACT (for ACTive pull-up). Initially, RNL* is biased to Vcc/2 and ACT is biased to ground. Since the digit line pair D1 20 and D1* 22 are both initially at Vcc/2 volts, the N-sense-amp transistors 42, 44 remain off due to zero Vgs potential. Similarly, both P-sense-amp transistors 32, 34 remain off due to their positive Vgs potential. A signal voltage develops between the digit line pair 20, 22 when the memory cell access occurs. While one digit line contains charge from the cell access, the other digit line serves as a reference for the sensing operation. The sense amplifier firing generally occurs sequentially rather than concurrently. The N-sense-amp 40 fires first and the P-sense-amp 30 second. The N-sense amplifier is fired by providing a signal, labeled NSA to a transistor 46 connecting the common node of the N-sense amplifier to ground. Dropping the RNL* signal toward ground will fire the N-sense-amp 40. As the voltage between RNL* and the digit lines approaches Vt, the NMOS transistor whose gate connection is to the higher voltage digit line will begin to conduct. Conduction results in the discharge of the low voltage digit line toward the RNL* voltage. Ultimately, RNL* will reach ground, bringing the digit line with it. Note that the other NMOS transistor will not conduct since its gate voltage derives from the low voltage digit line, which is discharging toward ground.

Shortly after the N-sense-amp 40 fires, ACT will be driven toward Vcc by applying a low signal PSA to PMOS transistor 48, thus connecting the common node of the P-sense amplifier 30 to Vcc. This activates the P-sense-amp 30 that operates in a complementary fashion to the N-sense-amp 40. With the low voltage digit line approaching ground, a strong signal exists to drive the appropriate PMOS transistor into conduction. This will charge the high voltage digit line toward Vcc, ultimately reaching Vcc. Since the memory bit transistor remains on during sensing, the memory bit capacitor will charge to the RNL* or ACT voltage level. The voltage, and hence charge, which the memory bit capacitor held prior to accessing will restore a full level, i.e., Vcc for a logic one and GND for a logic zero.

Figure 3:
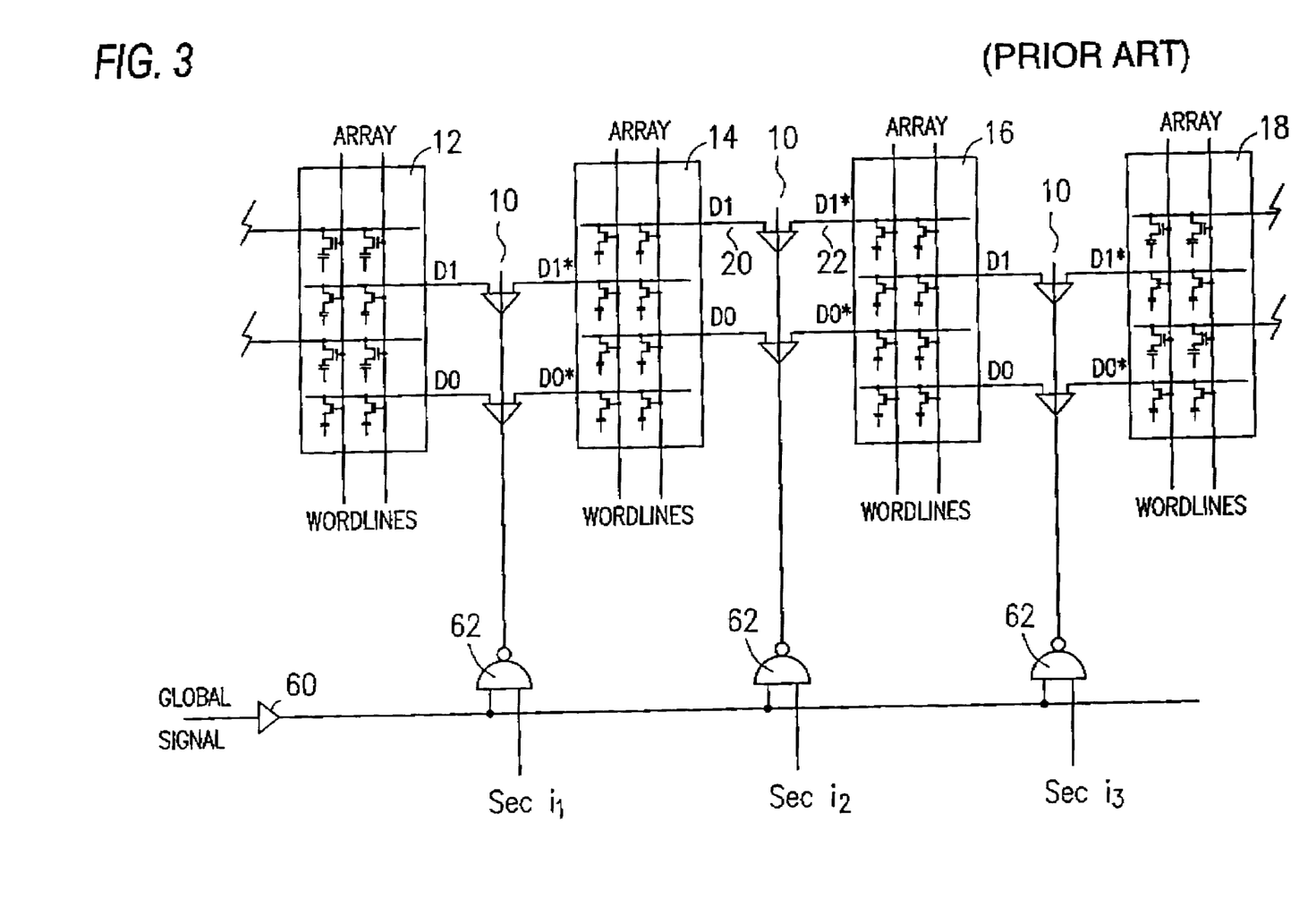
FIG. 3 illustrates a conventional circuit for firing sense amplifiers in a memory device with an open digit line architecture.

In an open digit line architecture as illustrated in FIG. 1, sense amplifiers on each side of an array, or section, are fired. Typically, as illustrated in FIG. 3, a global signal, such as for example the EQ, NSA or PSA signal, is driven across the memory device by a driver 60 and input to a NAND gate 62 with a section signal, supplied by a signal source such as a buffer amplifier, to fire the sense amps on each side of a specific section. For example, as illustrated in FIG. 3, if a row was fired in array 14, the sense amps would fire on both the left and right side of array 14. Problems exist, however, due to the signal noise inherent in an open digit line architecture (due to various coupling effects) and signal propagation of the global signal. For example, the signal propagation causes the left side to fire slightly before the right side. This slight difference in firing time can cause a margin imbalance on one side of the section as opposed to the other side of the section. That is, the side that fires last will have a reduced signal sensitivity margin for sensing data which can lead to erroneous reading of the data signal. Ideally both sense amps on each side should fire simultaneously.

Thus, there exists a need for an open digit line architecture in which the sense amplifiers on each side of a section are fired simultaneously, thus eliminating margin imbalance on one side of the section as opposed to the other side of the section.

SUMMARY OF THE INVENTION

The present invention overcomes the problems associated with the prior art and provides a method and apparatus for simultaneously firing the sense amplifiers on each side of a section, thereby significantly reducing any margin imbalance between the two sides.

In accordance with the present invention, firing of the sense amplifiers on each side of a section is controlled by a two stage NAND gate logic circuit that utilizes a tree routing scheme. By gating the global signal with a section signal through the two stage NAND gate logic circuit, the sense amplifiers on each side of a section can be fired simultaneously.

These and other advantages and features of the invention will become more readily apparent from the following detailed description of the invention which is provided in connection with the accompanying drawings.

DETAILED DESCRIPTION OF THE PREFERRED EMBODIMENTS

The present invention will be described as set forth in the exemplary embodiments illustrated in FIGS. 4–6. Other embodiments may be utilized and structural or logical changes may be made without departing from the spirit or scope of the present invention. Like items are referred to by like reference numerals.

In accordance with the present invention, firing of the sense amplifiers on each side of a section is controlled by a two stage NAND gate logic circuit that utilizes a tree routing scheme. By gating the global signal with a section signal through the two stage NAND gate logic circuit, the sense amplifiers on each side of a section can be fired simultaneously.

Figure 4:
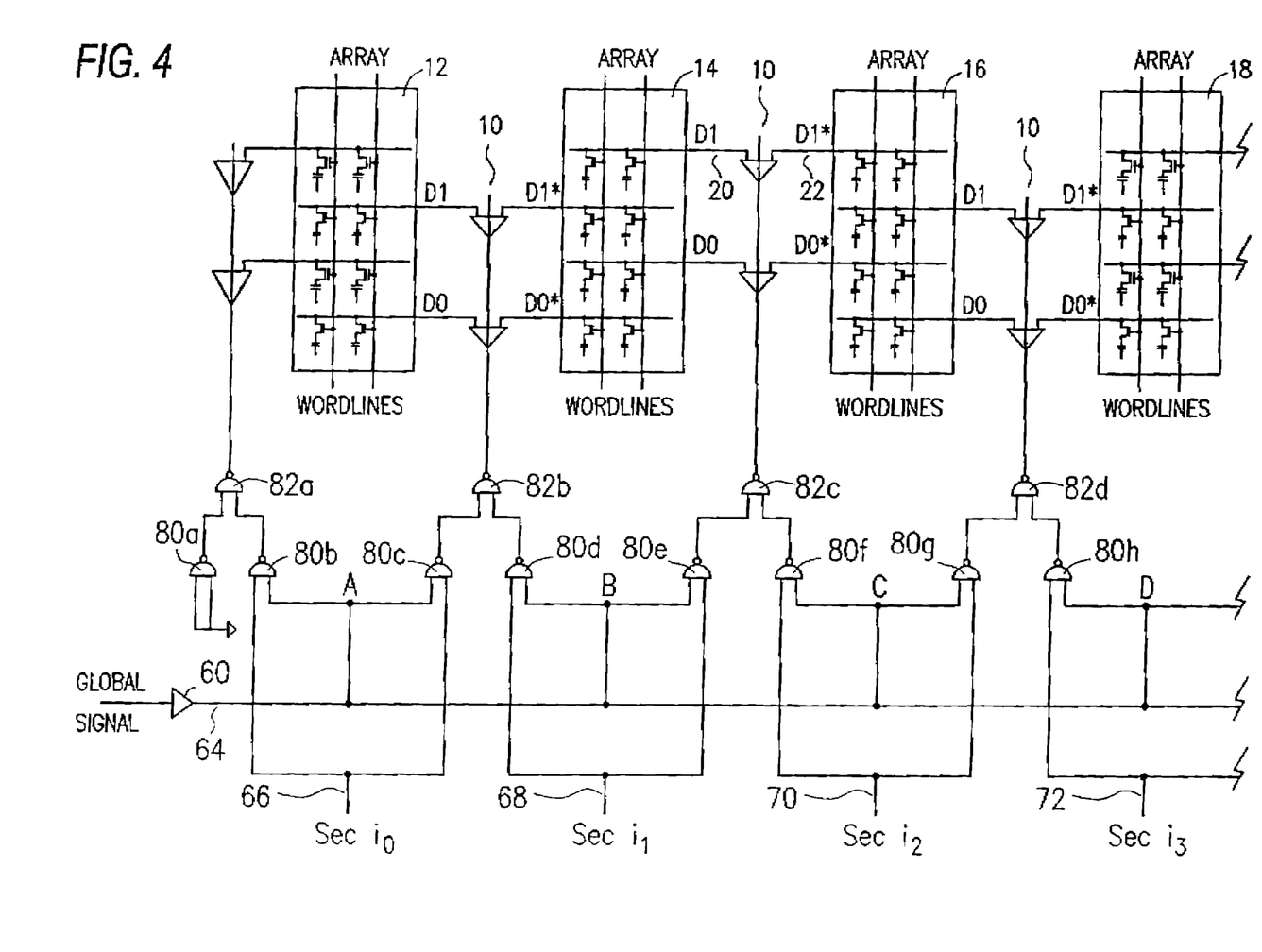
FIG. 4 illustrates a portion of a circuit for firing sense amplifiers in a memory device with an open digit line architecture according to one embodiment of the present invention.

FIG. 4 illustrates a portion of a circuit for firing sense amplifiers in a memory device with an open digit line architecture according to one embodiment of the present invention. As illustrated in FIG. 4, the firing of the sense amplifiers 10 is controlled by a global signal and a section signal that are passed through a two stage NAND gate logic circuit. The two stage NAND gate logic circuit includes a first stage of NAND gates 80a–80h. The first NAND gate 80a, located at the edge of the row of arrays 12, 14, 16 has both inputs connected to ground. NAND gates 80b and 80c each have a first input connected to the global signal line 64 and a second input connected to receive the section signal Sec $i_0$ on line 66. NAND gates 80d and 80e each have a first input connected to the global signal line 64 and a second input connected to receive the section signal Sec $i_1$ on line 68. NAND gates 80f and 80g each have a first input connected to the global signal line 64 and a second input connected to receive the section signal Sec $i_2$ on line 70.

The second stage of the two stage NAND gate logic circuit includes NAND gates 82a–82d. The output signal from each NAND gate 82a–82d is provided to the sense amplifiers 10 on a respective side of the arrays 12, 14, 16. NAND gate 82a has a first input connected to the output of NAND gate 80a and a second input connected to the output of NAND gate 80b. The output of NAND gate 82a is input to the sense amplifiers 10 located on the left side of array 12 as illustrated. NAND gate 82b has a first input connected to the output of NAND gate 80c and a second input connected to the output of NAND gate 80d. The output of NAND gate 82b is input to the sense amplifiers 10 located between array 12 and array 14 as illustrated. NAND gate 82c has a first input connected to the output of NAND gate 80e and a second input connected to the output of NAND gate 80f. The output of NAND gate 82c is input to the sense amplifiers 10 located between array 14 and array 16 as illustrated. NAND gate 82d has a first input connected to the output of NAND gate 80g and a second input connected to the output of NAND gate 80h. The output of NAND gate 82d is input to the sense amplifiers 10 located between array 14 and array 16 as illustrated.

In accordance with the tree routing of the present invention, it is preferable for the global signal line to connect to each pair of corresponding first stage NAND gates at a point equidistant between the pair to ensure there is no difference in signal propagation for each pair. Thus, for example, node A is a point equidistant from NAND gates 80b and 80c, node B is a point equidistant from NAND gates 80d and 80e, node C is a point equidistant from NAND gates 80f and 80g, etc. Additionally, it is also preferable for the routing distance from each pair of the first stage of NAND gates to their corresponding second stage NAND gates to be of equal length. Thus, for example, the routing distance from NAND gates 80a and 80b to NAND gate 82a, NAND gates 80c and 80d to NAND gate 82b, NAND gates 80d and 80e to NAND gate 82c, etc. is the same to ensure that the selected pair of second stage NAND gates fire simultaneously as will be further described below.

The operation of the two stage NAND gate logic circuit is as follows. Suppose for example a row in array 14 will be accessed. Accordingly, the sense amplifiers 10 on each side of the array 14 will be fired. A global signal, such as for example the NSA or EQ signal, will be driven high by driver 60 and input to the first input of each NAND gate 80b–80h. It should be understood that a separate two stage NAND gate logic circuit is required for each signal, that is, for each of the signals NSA, EQ, PSA, etc. In accordance with the present invention, the tree routing of the global signal ensures there is no difference in signal propagation delay between corresponding pairs of NAND gates and the global signal will be input to a corresponding pair of NAND gates simultaneously. Thus for example, NAND gates 80b and 80c receive the global signal at the same time, NAND gates 80d and 80e receive the global signal at the same time, and NAND gates 80f and 80g receive the global signal at the same time. Because a row in array 14 is being accessed, the signal Sec $i_1$ on line 68 will be driven high by a memory controller (not shown), while the remaining section signals Sec $i_0$, Sec $i_2$ and Sec $i_3$ will remain low. Thus, the high input of the global signal on line 64 and the low section signal inputs on lines 66, 70 and 72 will cause a high output from each of NAND gates 80b, 80c, 80f, 80g and 80h. Additionally, since both the inputs to NAND gate 80a are tied to ground, i.e., a low signal, the output of NAND gate 80a will be a high output. The high input of the global signal on line 64 and the high section signal Sec $i_1$ on line 68 will cause a low output from each of NAND gates 80d and 80e.

The inputs to NAND gates 82a and 82d will both be high (from NAND gates 80a, 80b and 80g, 80h, respectively). Thus, the outputs from NAND gates 82a and 82d will be low. The first input to NAND gates 82b and 82c will be high (from NAND gates 80c and 80f, respectively) and the second input to NAND gates 82b and 82c will be low (from NAND gates 80d and 80c, respectively). Thus, the output from NAND gates 82b and 82c will be high.

The sense amplifiers 10 on each side of array 14, upon receiving the high signals from the outputs of NAND gates 82b and 82c, will then fire. For example, if the global signal is an EQ signal for the equilibration circuit 50 (FIG. 2), the high output signal from NAND gates 82b, 82c will be applied to the gates of transistors 52, 54, 56. Alternatively, if the global signal is the NSA signal to fire the N-sense amplifier 40, the high output signal from NAND gates 82b, 82c will be applied to the gate of transistor 46. The sense amplifiers 10 receiving a low output signal from NAND gates 82a, 82d will not fire. As noted above, since the tree routing of the global signal eliminates any difference in the propagation delay between corresponding pairs of NAND gates, the outputs from NAND gates 82b and 82c will transition from low to high at the same time, thus firing the sense amplifiers 10 on each side of array 14 at the same time.

Thus, in accordance with the present invention, by gating the global signal with a section signal through the two stage NAND gate logic circuit, the sense amplifiers on each side of a section can be fired simultaneously.

Figure 5:
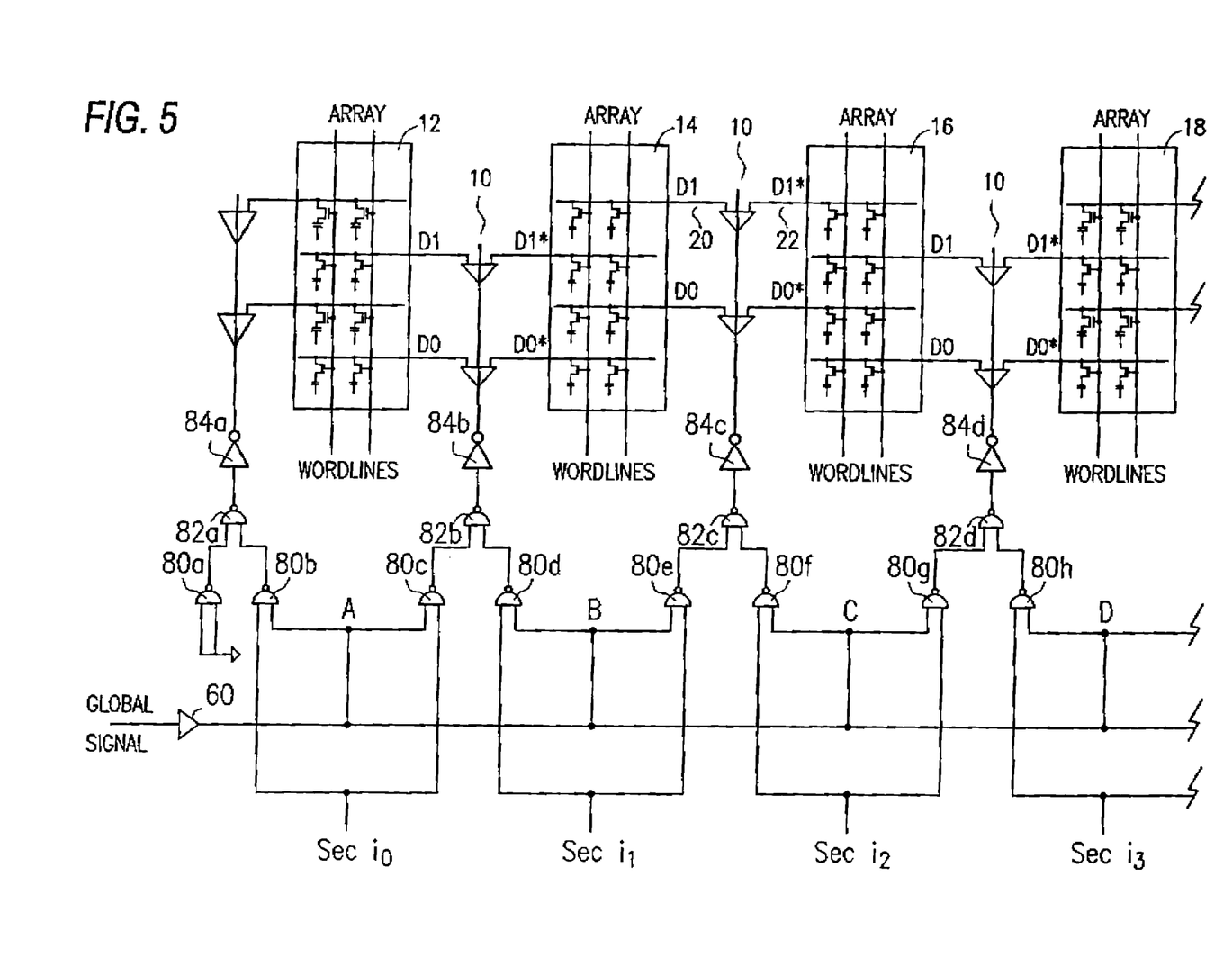
FIG. 5 illustrates a portion of a circuit for firing sense amplifiers in a memory device with an open digit line architecture according to another embodiment of the present invention.

FIG. 5 illustrates a portion of a circuit for firing sense amplifiers in a memory device with an open digit line architecture according to another embodiment of the present invention. In the embodiment of FIG. 5, the two stage logic circuit can be utilized to provide a low signal required to fire the sense amplifiers 10. For example, to fire the P-sense amplifier 30 of a sense amplifier 10, a low signal PSA must be applied to the gate of transistor 48 to turn on transistor 48. The circuit of FIG. 5 is identical to that of FIG. 4, except that an inverter 84a, 84b, 84c, 84d is provided at the output of NAND gate 82a, 82b, 82c and 82d, respectively.

Thus, if as in the above example a row in array 14 is to be accessed, the high outputs from NAND gates 82b and 82c will be inverted by inverters 84b, 84c respectively and the low outputs from the inverters 84b, 84c will be applied to the gate of transistor 48 in the respective sense amplifiers 10 to fire the P-sense amplifier 30 in each sense amplifier 10. The low outputs from NAND gates 82a and 82b will be inverted by inverters 84a, 84d respectively and the high outputs from the inverters 84a, 84d will maintain the transistors 48 in an off state, thus not firing the respective P-sense amplifiers 30 in the other arrays.

Figure 6:
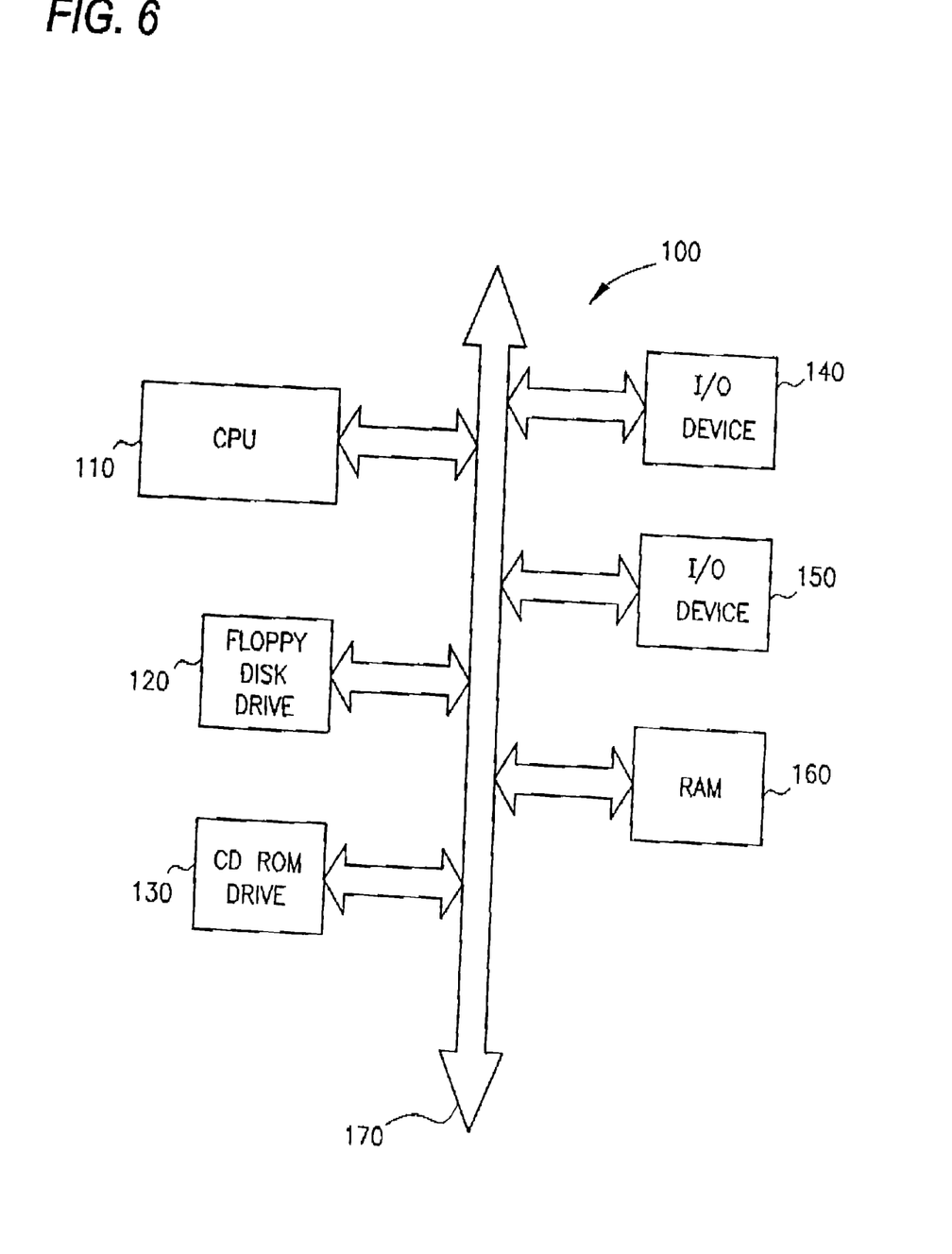
FIG. 6 illustrates in block diagram form a processor system that includes a memory circuit having a circuit according to the present invention.

A typical processor based system that includes memory circuits having two stage logic circuit according to the present invention is illustrated generally at 100 in FIG. 6. A computer system is exemplary of a system having memory circuits. Most conventional computers include memory devices permitting storage of significant amounts of data. The data is accessed during operation of the computers. Other types of dedicated processing systems, e.g., radio systems, television systems, GPS receiver systems, telephones and telephone systems also contain memory devices which can utilize the present invention.

A processor based system, such as a computer system, for example, generally comprises a central processing unit (CPU) 110, for example, a microprocessor, that communicates with one or more input/output (I/O) devices 140, 150 over a bus 170. The computer system 100 also includes random access memory (RAM) 160, and, in the case of a computer system may include peripheral devices such as a floppy disk drive 120 and a compact disk (CD) ROM drive 130 which also communicate with CPU 110 over the bus 170. RAM 160 is preferably constructed as an integrated circuit that includes a two stage NAND gate logic circuit as previously described with respect to FIGS. 4 and 5. It may also be desirable to integrate the processor 110 and memory 160 on a single IC chip.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A sense amplifier control circuit for a memory device comprising:

a first logic gate having a first input coupled to a source of a global control signal, a second input coupled to a source of a first section signal, and an output;

a second logic gate having a first input coupled to said source of said global control signal, a second input coupled to a source of a second section signal, and an output;

a third logic gate having a first input coupled to said source of said global control signal, a second input coupled to said source of said second section signal, and an output;

a fourth logic gate having a first input coupled to said source of said global control signal, a second input coupled to a source of a third section signal, and an output;

said first, second, third and fourth logic gates substantially electrically equidistant from said source of said global control signal;

a fifth logic gate having a first input coupled to said output of said first logic gate, a second input coupled to said output of said second logic gate, and an output coupled to a sense amplifier on a first side of a section of said memory; and a sixth logic gate having a first input coupled to said output of said third logic gate, a second input coupled to said output of said fourth logic gate, and an output coupled to a sense amplifier on a second side of a section of said memory, wherein when said global control signal and said second section signal are active, said fifth and sixth logic gates provide a sense amplifier control signal to said sense amplifiers on said first and second sides of said section of said memory, respectively, to activate said sense amplifiers on said first and second sides of said section of said memory substantially simultaneously.

2. The control circuit according to claim 1, further comprising:

a first inverter coupled between said output of said fifth logic gate and said sense amplifier on said first side of said section of said memory; and a second inverter coupled between said output of said sixth logic gate and said sense amplifier on said second side of said section of said memory.

3. The control circuit according to claim 2, wherein said sense amplifier control signal fires a P-sense amplifier in said sense amplifiers on said first and second sides of said section of said memory.

4. The control circuit according to claim 1, wherein each of said first, second, third, fourth, fifth and sixth logic gates are NAND gates.

5. The control circuit according to claim 1, wherein if said section of said memory is located at an edge of said memory, said first and second input of said first logic gate are coupled to ground.

6. The control circuit according to claim 1, wherein said sense amplifier control signal fires a N-sense amplifier in said sense amplifiers on said first and second sides of said section of said memory.

7. The control circuit according to claim 1, wherein said sense amplifier control signal fires an equilibration circuit in said sense amplifiers on said first and second sides of said section of said memory.

8. The control circuit according to claim 1, wherein said global control signal is input to said second and third logic gates at substantially the same time.

9. A circuit for providing a respective control signal to sense amplifiers located on each side of a plurality of sections of a memory, said circuit comprising:

a first plurality of NAND gates, each of said first plurality of NAND gates having a first input coupled to a source of a global control signal and a second input coupled to a source of a respective section signal, said respective section signal being associated with a respective one of said plurality of sections, each gate of said first plurality of NAND gates substantially electrically equidistant from said source of said global control signal; and a second plurality of NAND gates, each of said second plurality of NAND gates having a first input coupled to an output of one of said first plurality of NAND gates, a second input coupled to an output of another of said first plurality of NAND gates, and an output coupled to a respective one of said sense amplifiers, said output providing said respective control signal to said respective one of said sense amplifiers.

10. The circuit according to claim 9, further comprising:

a plurality of inverters, each of said inverters having an input coupled to an output of a respective one of said second plurality of NAND gates and an output coupled to said respective one of said sense amplifiers to provide said respective control signal to said respective one of said sense amplifiers.

11. The circuit according to claim 10, wherein said control signal fires a P-sense amplifier in said respective one of said sense amplifiers on each side of one of said sections substantially simultaneously.

12. The circuit according to claim 9, wherein said control signal fires a N-sense amplifier in said respective one of said sense amplifiers on each side of one of said sections substantially simultaneously.

13. The circuit according to claim 9, wherein said control signal fires an equilibration circuit in said respective one of said sense amplifiers on each side of one of said sections substantially simultaneously.

14. The circuit according to claim 9, wherein said global control signal is received by a corresponding pair of said first plurality of NAND gates at substantially the same time.

15. The circuit according to claim 9, wherein said one of said first plurality of NAND gates and said another of said first plurality of NAND gates are equidistant from a respective one of said second plurality of NAND gates.

16. A memory device comprising:

a plurality of sections, each of said plurality of sections including an array of memory cells;

a plurality of rows of sense amplifiers, each of said plurality of rows of sense amplifiers being located between a pair of said plurality of sections; and a control circuit for providing a respective control signal to each of said plurality of rows of sense amplifiers, said control circuit comprising:

a first plurality of NAND gates, each of said first plurality of NAND gates having a first input coupled to a source of a global control signal and a second input coupled to a source of a respective section signal, said respective section signal being associated with a respective one of said plurality of sections, each gate of said first plurality of NAND gates substantially electrically equidistant from said source of said global control signal; and a second plurality of NAND gates, each of said second plurality of NAND gates having a first input coupled to an output of one of said first plurality of NAND gates, a second input coupled to an output of another of said first plurality of NAND gates, and an output coupled to a respective one of said rows of sense amplifiers to provide said respective control signal to said respective one of said rows of sense amplifiers.

17. The memory device according to claim 16, wherein said control circuit further comprises:
a plurality of inverters, each of said inverters having an input coupled to an output of a respective one of said second plurality of NAND gates and an output coupled to said respective one of said rows of sense amplifiers to provide said respective control signal to said respective one of said rows of sense amplifiers.

18. The memory device according to claim 17, wherein said respective control signal fires a P-sense amplifier in said respective one of said rows of sense amplifiers on each side of one of said sections substantially simultaneously.

19. The memory device according to claim 16, wherein said respective control signal fires an N-sense amplifier in said respective one of said rows of sense amplifiers on each side of one of said sections substantially simultaneously.

20. The memory device according to claim 16, wherein said respective control signal fires an equilibration circuit in said respective one of said rows of sense amplifiers on each side of one of said sections substantially simultaneously.

21. The memory device according to claim 16, wherein said global control signal is received by a corresponding pair of said first plurality of NAND gates at substantially the same time.

22. The memory device according to claim 16, wherein said one of said first plurality of NAND gates and said another of said first plurality of NAND gates are equidistant from a respective one of said second plurality of NAND gates.

23. A memory device comprising:
a plurality of sections, each of said plurality of sections including an array of memory cells;
a plurality of rows of sense amplifiers, each of said plurality of rows of sense amplifiers being located between a pair of said plurality of sections; and
a control circuit for providing a respective control signal to each of said plurality of rows of sense amplifiers, said control circuit comprising:
a first logic gate having a first input coupled to a source of a global control signal, a second input coupled to a source of a first section signal associated with a first one of said plurality of sections, and an output;
a second logic gate having a first input coupled to said source of said global control signal, a second input coupled to a source of a second section signal associated with a second one of said plurality of sections, and an output;
a third logic gate having a first input coupled to said source of said global control signal, a second input coupled to said source of said second section signal, and an output;
a fourth logic gate having a first input coupled to said source of said global control signal, a second input coupled to a source of a third section signal associated with third one of said plurality of sections, and an output;
said first, second, third and fourth logic gates substantially electrically equidistant from said source of said global control signal;
a fifth logic gate having a first input coupled to said output of said first logic gate, a second input coupled to said output of said second logic gate, and an output coupled to said row of sense amplifiers located between said first one and said second one of said plurality of sections; and a sixth logic gate having a first input coupled to said output of said third logic gate, a second input coupled to said output of said fourth logic gate, and an output coupled to said row of sense amplifiers located between said second one and said third one of said plurality of sections,
wherein when said global control signal and said second section signal are active, said fifth and sixth logic gates provide a sense amplifier control signal to said row of sense amplifiers located between said first one and said second one of said plurality of sections and said row of sense amplifiers located between said second one and said third one of said plurality of sections, respectively, to activate said row of sense amplifiers located between said first one and said second one of said plurality of sections and said row of sense amplifiers located between said second one and said third one of said plurality of sections substantially simultaneously.

24. The memory device according to claim 23, said control circuit further comprising:
a first inverter coupled between said output of said fifth logic gate and said row of sense amplifiers located between said first one and said second one of said plurality of sections; and
a second inverter coupled between said output of said sixth logic gate and said row of sense amplifiers located between said second one and said third one of said plurality of sections.

25. The memory device according to claim 24, wherein said respective control signal fires a P-sense amplifier in said sense amplifiers located between said first one and said second one of said plurality of sections and said row of sense amplifiers located between said second one and said third one of said plurality of sections.

26. The memory device according to claim 23, wherein each of said first, second, third, fourth, fifth and sixth logic gates are NAND gates.

27. The memory device according to claim 23, wherein if said first one of said plurality of sections of said memory is located at an edge of said memory, said first and second input of said first logic gate are coupled to ground.

28. The memory device according to claim 23, wherein said respective control signal fires an N-sense amplifier in said row of sense amplifiers located between said first one and said second one of said plurality of sections and said row of sense amplifiers located between said second one and said third one of said plurality of sections.

29. The memory device according to claim 23, wherein said respective control signal fires an equilibration circuit in said row of sense amplifiers located between said first one and said second one of said plurality of sections and said row of sense amplifiers located between said second one and said third one of said plurality of sections.

30. A memory device comprising:
a plurality of arrays;
a plurality of rows of sense amplifiers, each of said plurality of rows of sense amplifiers being between a respective pair of said plurality of arrays; and
a logic circuit including a tree circuit, for providing a respective control signal to each of said plurality of rows of sense amplifiers, said logic circuit causing said respective control signal to be applied to respective rows of said sense amplifiers on each side of at least one of said plurality of arrays substantially simultaneously.

31. The memory device according to claim 30, wherein in response to said respective control signal, a P-sense amplifier in said respective row is activated.

32. The memory device according to claim 30, wherein in response to said respective control signal, an N-sense amplifier in said respective row is activated.

33. The memory device according to claim 32, wherein in response to said respective control signal, an equilibration circuit in said respective row is activated.

34. A processor system comprising:
a processing unit; and
a memory device connected to said processing unit, said memory device comprising:
   a plurality of sections, each of said plurality of sections including an array of memory cells;
   a plurality of rows of sense amplifiers, each of said plurality of rows of sense amplifiers being located between a pair of said plurality of sections; and
   a control circuit for providing a respective control signal to each of said plurality of rows of sense amplifiers, said control circuit comprising:
      a first plurality of NAND gates, each of said first plurality of NAND gates having a first input coupled to a source of a global control signal and a second input coupled to a source of a respective section signal, said respective section signal being associated with a respective one of said plurality of sections, each gate of said first plurality of NAND gates substantially electrically equidistant from said source of said global control signal; and
      a second plurality of NAND gates, each of said second plurality of NAND gates having a first input coupled to an output of one of said first plurality of NAND gates, a second input coupled to an output of another of said first plurality of NAND gates, and an output coupled to a respective one of said rows of sense amplifiers to provide said respective control signal to said respective one of said rows of sense amplifiers.

35. The processor system according to claim 34, wherein said control circuit further comprises:
a plurality of inverters, each of said inverters having an input coupled to an output of a respective one of said second plurality of NAND gates and an output coupled to said respective one of said rows of sense amplifiers to provide said respective control signal to said respective one of said rows of sense amplifiers.

36. The processor system according to claim 35, wherein said respective control signal fires a P-sense amplifier in said respective one of said rows of sense amplifiers on each side of one of said sections substantially simultaneously.

37. The processor system according to claim 34, wherein said respective control signal fires an N-sense amplifier in said respective one of said rows of sense amplifiers on each side of one of said sections substantially simultaneously.

38. The processor system according to claim 34, wherein said respective control signal fires an equilibration circuit in said respective one of said rows of sense amplifiers on each side of one of said sections substantially simultaneously.

39. The processor system according to claim 34, wherein said processing unit and said memory device are on a same chip.

40. The processor system according to claim 34, wherein said global control signal is received by a corresponding pair of said first plurality of NAND gates at substantially the same time.

41. The processor system according to claim 34, wherein said one of said first plurality of NAND gates and said another of said first plurality of NAND gates are equidistant from a respective one of said second plurality of NAND gates.

42. A processor system comprising:
a processing unit; and
a memory device connected to said processing unit, said memory device comprising:
   a plurality of sections, each of said plurality of sections including an array of memory cells;
   a plurality of rows of sense amplifiers, each of said plurality of rows of sense amplifiers being located between a pair of said plurality of sections; and
   a control circuit for providing a respective control signal to each of said plurality of rows of sense amplifiers, said control circuit comprising:
      a first logic gate having a first input coupled to a source of a global control signal, a second input coupled to a source of a first section signal associated with a first one of said plurality of sections, and an output;
      a second logic gate having a first input coupled to said source of said global control signal, a second input coupled to a second section signal associated with a second one of said plurality of sections, and an output;
      a third logic gate having a first input coupled to said source of said global control signal, a second input coupled to said source of said second section signal, and an output;
      a fourth logic gate having a first input coupled to said source of said global control signal, a second input coupled to a source of a third section signal associated with third one of said plurality of sections, and an output;
   said first, second, third and fourth logic gates substantially electrically equidistant from said source of said global control signal;
      a fifth logic gate having a first input coupled to said output of said first logic gate, a second input coupled to said output of said second logic gate, and an output coupled to said row of sense amplifiers located between said first one and said second one of said plurality of sections; and
      a sixth logic gate having a first input coupled to said output of said third logic gate, a second input coupled to said output of said fourth logic gate, and an output coupled to said row of sense amplifiers located between said second one and said third one of said plurality of sections,
   wherein when said global control signal and said second section signal are active, said fifth and sixth logic gates provide a sense amplifier control signal to said row of sense amplifiers located between said first one and said second one of said plurality of sections and said row of sense amplifiers located between said second one and said third one of said plurality of sections, respectively, to activate said row of sense amplifiers located between said first one and said second one of said plurality of sections and said row of sense amplifiers located between said second one and said third one of said plurality of sections substantially simultaneously.

43. The processor system according to claim 42, said control circuit further comprising:
a first inverter coupled between said output of said fifth logic gate and said row of sense amplifiers located between said first one and said second one of said plurality of sections; and
a second inverter coupled between said output of said sixth logic gate and said row of sense amplifiers located between said second one and said third one of said plurality of sections.

44. The processor system according to claim 43, wherein said respective control signal fires a P-sense amplifier in said sense amplifiers located between said first one and said second one of said plurality of sections and said row of sense amplifiers located between said second one and said third one of said plurality of sections.

45. The processor system according to claim 42, wherein each of said first, second, third, fourth, fifth and sixth logic gates are NAND gates.

46. The processor system according to claim 42, wherein if said first one of said plurality of sections of said memory is located at an edge of said memory, said first and second input of said first logic gate are coupled to ground.

47. The processor system according to claim 42, wherein said respective control signal fires an N-sense amplifier in said row of sense amplifiers located between said first one and said second one of said plurality of sections and said row of sense amplifiers located between said second one and said third one of said plurality of sections.

48. The processor system according to claim 42, wherein said respective control signal fires an equilibration circuit in said row of sense amplifiers located between said first one and said second one of said plurality of sections and said row of sense amplifiers located between said second one and said third one of said plurality of sections.

49. A processor system comprising:
a processing unit; and
a memory device connected to said processing unit, said memory device comprising:
a plurality of arrays;
plurality of rows of sense amplifiers, each of said plurality of rows of sense amplifiers being between a respective pair of said plurality of arrays; and
a logic circuit including a tree circuit, for providing a respective control signal to each of said plurality of rows of sense amplifiers, said logic circuit causing said respective control signals to be applied to respective rows of said sense amplifiers on each side of at least one of said plurality of arrays substantially simultaneously.

50. The processor system according to claim 49, wherein in response to said respective control signal, a P-sense amplifier in said respective row is activated.

51. The processor system according to claim 49, wherein in response to said respective control signal, an N-sense amplifier in said respective row is activated.

52. The processor system according to claim 49, wherein in response to said respective control signal, an equilibration circuit in said respective row is activated.

53. The processor system according to claim 49, wherein said processing unit and said memory device are on a same chip.

54. A method for firing sense amplifiers on a first and second side of a section of a memory, said method comprising:
inputting a global control signal to a first input of a first plurality of logic gates substantially simultaneously;
inputting a respective section signal to a second input of each of said first plurality of logic gates, said respective section signal being associated with said section of said memory;
inputting an output from a first of said first plurality of logic gates to a first input of a first one of a second plurality of logic gates;
inputting an output from a second of said first plurality of logic gates to a second input of said first one of said second plurality of logic gates;
inputting an output from a third of said first plurality of logic gates to a first input of a second one of said second plurality of logic gates;
inputting an output from a fourth of said first plurality of logic gates to a second input of said second one of said second plurality of logic gates; and
providing an output of said first one of said second plurality of logic gates to said sense amplifiers on said first side of said section of said memory and an output of said second one of said second plurality of logic gates to said sense amplifiers on said second side of said section of said memory, said sense amplifiers firing in response to said outputs.

55. The method according to claim 54, further comprising the step of:
providing said output of said first one of said second plurality of logic gates to an input of a first inverter and said output of said second one of said second plurality of logic gates to an input of a second inverter; and
providing an output of said first inverter to said sense amplifiers on said first side of said section of said memory and an output of said second inverter to said sense amplifiers on said second side of said section of said memory, said sense amplifiers firing in response to said outputs of said inverters.

56. The method according to claim 55, wherein said firing of said sense amplifiers further comprises:
firing a P-sense amplifier in said sense amplifiers on said first and second side of said section of said memory.

57. The method according to claim 54, wherein said firing of said sense amplifiers further comprises:
firing an N-sense amplifier in said sense amplifiers on said first and second side of said section of said memory.

58. The method according to claim 54, wherein said firing of said sense amplifiers further comprises:
firing an equilibration circuit in said sense amplifiers on said first and second side of said section of said memory.

59. The method according to claim 54, wherein said firing of said sense amplifiers further comprises:
firing said sense amplifiers on said first and second side of said section of said memory substantially simultaneously.

60. A method for providing a control signal to sense amplifiers located on each side of an array of a memory device, said method comprising:
providing a global signal to a logic circuit;
providing a section signal to said logic circuit, said section signal being associated with said array;
determining an output signal for said logic circuit to output to said sense amplifiers, said output signal being based on said global signal and said section signal; and
providing said output signal as said control signal to said sense amplifiers on each side of said array substantially simultaneously.

61. The method according to claim 60, wherein said logic circuit comprises a plurality of NAND gates.

62. The method according to claim 61, wherein said logic circuit further comprises a plurality of inverters.

63. The method according to claim 60, wherein said control signal causes a P-sense amplifier in said sense amplifiers to activate.

64. The method according to claim 60, wherein said control signal causes an N-sense amplifier in said sense amplifiers to activate.

65. The method according to claim 60, wherein said control signal causes an equilibration circuit in said sense amplifiers to activate.

66. A memory device comprising:

a plurality of arrays;

a plurality of rows of sense amplifiers, each of said plurality of rows of sense amplifiers being between a respective pair of said plurality of arrays; and a logic circuit including a plurality of NAND gates coupled in an equidistant tree circuit, for providing a respective control signal to each of said plurality of rows of sense amplifiers, said logic circuit causing said respective control signal to be applied to respective rows of said sense amplifiers on each side of at least one of said plurality of arrays substantially simultaneously.

67. A memory device comprising:

a plurality of arrays;

a plurality of rows of sense amplifiers, each of said plurality of rows of sense amplifiers being between a respective pair of said plurality of arrays; and a logic circuit for providing a respective control signal to each of said plurality of rows of sense amplifiers, said logic circuit including a first plurality of NAND gates, each of said first plurality of NAND gates having a first input coupled to a source of a global control signal and a second input coupled to a source of a respective section signal, said respective section signal being associated with a respective one of said plurality of arrays, each gate of said first plurality of NAND gates substantially electrically equidistant from said source of said global control signal, and a second plurality of NAND gates, each of said second plurality of NAND gates having a first input coupled to an output of one of said first plurality of NAND gates, a second signal input coupled to an output of another of said first plurality of NAND gates, and an output coupled to a respective one of said rows of sense amplifiers to provide said respective control signal to said respective rows of said sense amplifiers on each side at least one of said plurality of arrays, said logic circuit causing said respective control signal to be applied to respective rows of said sense amplifiers on each side of at least one of said plurality of arrays substantially simultaneously.

68. The memory device according to claim 67, wherein said logic circuit further comprises:

a plurality of inverters, each of said inverters having an input coupled to an output of a respective one of said second plurality of NAND gates and an output coupled to said respective one of said rows of sense amplifiers to provide said respective control signal to said respective rows of said sense amplifiers on each side of said at least one of said plurality of arrays.

69. The memory device according to claim 68, wherein said respective control signal fires a P-sense amplifier in said respective rows of said sense amplifier on each side of said at least one of said plurality of arrays.

70. A processor system comprising:

a processing unit; and a memory device connected to said processing unit, said memory comprising:

a plurality of arrays;

a plurality of rows of sense amplifiers, each of said plurality of rows of sense amplifiers being between a respective pair of said plurality of arrays; and a logic circuit including a plurality of NAND gates coupled in a tree circuit, for providing a respective control signal to each of said plurality of rows of sense amplifiers, said logic circuit causing said respective control signals to be applied to respective rows of said sense amplifiers on each side of at least one of said plurality of array substantially simultaneously.

71. A processor system comprising:

a processing unit; and a memory device connected to said processing unit, said memory comprising:

a plurality of arrays;

a plurality of rows of sense amplifiers, each of said plurality of rows of sense amplifiers being between a respective pair of said plurality of arrays; and a logic circuit for providing a respective control signal to each of said plurality of rows of sense amplifiers, said logic circuit including a first plurality of NAND gates, each of said first plurality of NAND gates having a first input coupled to a source of a global control signal and a second input coupled to a source of a respective section signal, said respective section signal being associated with a respective one of said plurality of arrays, each gate of said first plurality of NAND gates substantially electrically equidistant from said source of said global control signal, and a second plurality of NAND gates, each of said second plurality of NAND gates having a first input coupled to an output of one of said first plurality of NAND gates, a second signal input coupled to an output of another of said first plurality of NAND gates, and an output coupled to a respective one of said rows of sense amplifier to provide said respective control signal to said respective rows of said sense amplifier on each side of said at least one of said plurality of arrays, said logic circuit causing said respective control signals to be applied to respective rows of said sense amplifiers on each side of at least one of said plurality of array substantially simultaneously.

72. The processor system according to claim 71, wherein said logic circuit further comprises:

a plurality of inverters, each of said inverters having an input coupled to an output of a respective one of said second plurality of NAND gates and an output coupled to said respective one of said rows of sense amplifiers to provide said respective control signal to said respective rows of said sense amplifiers on each side of said at least one of said plurality of arrays.

73. The processor system according to claim 72, wherein said respective control signal fires a P-sense amplifier in said respective rows of said sense amplifier on each side of said at least one of said plurality of arrays.

* * * * *

UNITED STATES PATENT AND TRADEMARK OFFICE
CERTIFICATE OF CORRECTION

PATENT NO.     : 6,515,925 B2
DATED          : February 4, 2003
INVENTOR(S)    : Scot M. Graham et al.

It is certified that error appears in the above-identified patent and that said Letters Patent is hereby corrected as shown below:

Column 9,
Line 57, change "with third" to -- with a third --.

Column 12,
Line 31, change "with third" to -- with a third --.

Column 16,
Lines 15 and 48, change "array" to -- arrays --.

Signed and Sealed this

Fifteenth Day of July, 2003

JAMES E. ROGAN
*Director of the United States Patent and Trademark Office*